United States Patent [19]

Derfiny et al.

[11] Patent Number: 4,777,564
[45] Date of Patent: Oct. 11, 1988

[54] LEADFORM FOR USE WITH SURFACE MOUNTED COMPONENTS

[75] Inventors: Dennis J. Derfiny, Clarendon Hills, Ill.; Joseph D. Ceccoli, Mesa; Emery E. Baxter, Tempe, both of Ariz.

[73] Assignee: Motorola, Inc., Schaumburg, Ill.

[21] Appl. No.: 122,606

[22] Filed: Nov. 17, 1987

Related U.S. Application Data

[63] Continuation of Ser. No. 918,695, Oct. 16, 1986, abandoned, which is a continuation of Ser. No. 880,659, Jul. 1, 1986, abandoned, which is a continuation of Ser. No. 614,602, May 29, 1984, abandoned.

[51] Int. Cl.$^4$ ................................................. H01R 9/00
[52] U.S. Cl. ...................................... 361/405; 357/68; 361/408
[58] Field of Search ......... 174/52 FP; 357/68, 70–71; 361/402–406, 408, 422; 439/68, 69, 876

[56] References Cited

U.S. PATENT DOCUMENTS

| | | | |
|---|---|---|---|
| 2,757,319 | 7/1956 | Kapp | 361/406 |
| 2,962,396 | 11/1960 | Pankove | 357/68 |
| 3,062,991 | 11/1962 | Kaidan | 317/101 |
| 3,308,526 | 3/1967 | Jellig | 29/155.5 |
| 3,693,052 | 9/1972 | Galanti | 361/405 |
| 3,745,513 | 7/1973 | Gross | 339/95 R |
| 3,750,252 | 8/1973 | Landmann | 339/275 B |
| 3,796,921 | 3/1974 | Fischer | 339/17 CF |
| 3,818,279 | 6/1974 | Seeger, Jr. et al. | 317/101 CM |
| 3,846,743 | 11/1974 | Garver | 339/275 B |
| 3,848,207 | 11/1974 | Bussey et al. | 361/405 |
| 3,984,166 | 8/1976 | Hutchison | 339/17 CF |
| 4,015,707 | 4/1977 | Kisor | 206/328 |
| 4,080,485 | 3/1978 | Bonkohara | 357/68 |
| 4,086,426 | 4/1978 | Knappenberger | 174/68.5 |
| 4,139,881 | 2/1979 | Shimizu et al. | 361/406 |
| 4,147,889 | 4/1979 | Andrews et al. | 174/52 FP |
| 4,184,043 | 1/1980 | Hildering | 174/68.5 |
| 4,187,388 | 2/1980 | Roberts | 174/68.5 |
| 4,326,239 | 4/1982 | Ohsawa et al. | 361/410 |
| 4,339,303 | 7/1982 | Frisch et al. | 156/629 |

FOREIGN PATENT DOCUMENTS

| | | | |
|---|---|---|---|
| 2742716 | 9/1977 | Fed. Rep. of Germany | 361/405 |
| 0306598 | 11/1969 | U.S.S.R. | 339/275 B |

OTHER PUBLICATIONS

Richard Lay, "A–B To Offer J–SOIC Packages," Electronic Engineering Times, 3/26/84, p. 64.
Jeffrey Shepard, "Component Comments", Electronic Engineering Times, 4/9/84.

Primary Examiner—A. D. Pellinen
Assistant Examiner—Gregory D. Thompson
Attorney, Agent, or Firm—Raymond A. Jenski; Rolland R. Hackbart

[57] ABSTRACT

An improved leadform for use with surface mount components is described. The improved leadform provides a connection to a printed circuit substrate which is highly resistant to stress related failures. The leadform is configured so that the connection utilizes a relatively greater area of the leadform for contact with a solder connection resulting in a more compliant connection. In addition, the present invention provides a preparation for the printed circuit media which allows the substrate media to absorb stresses which occur due to thermal cycling.

6 Claims, 3 Drawing Sheets

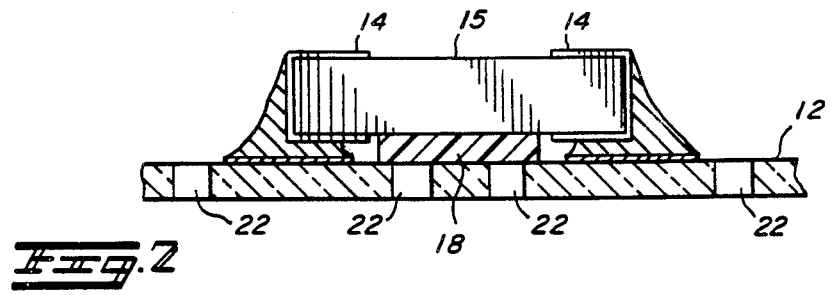
Fig. 2
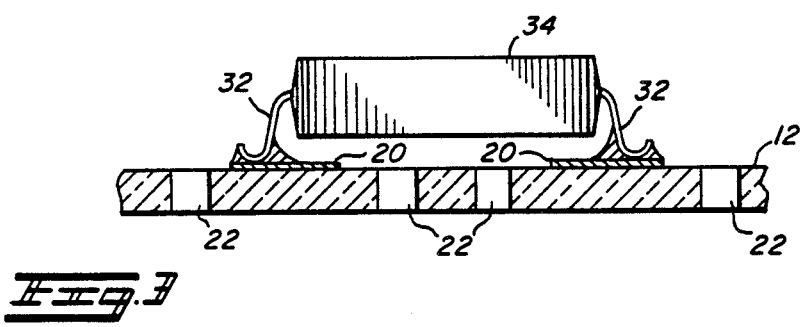
Fig. 3
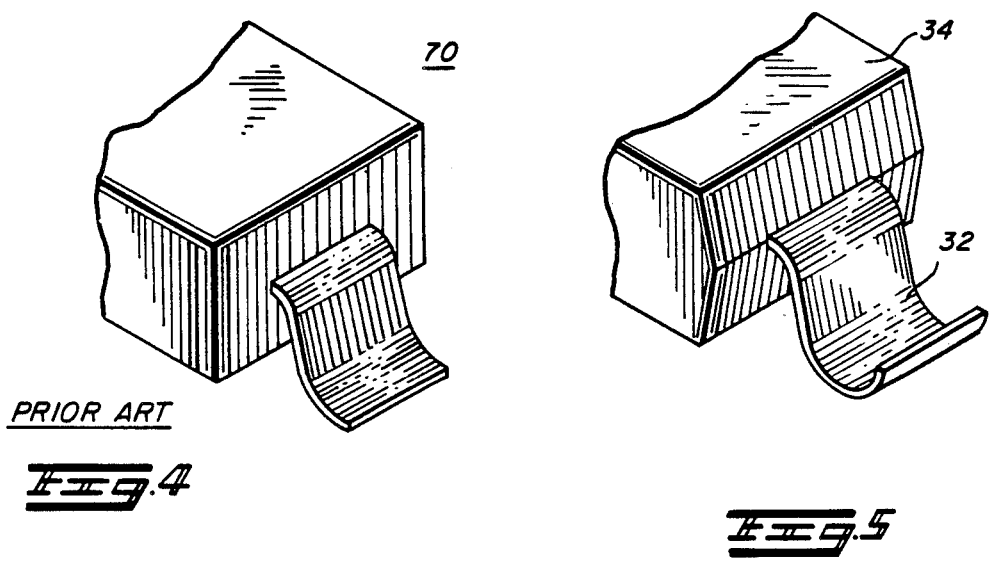
PRIOR ART
Fig. 4
Fig. 5

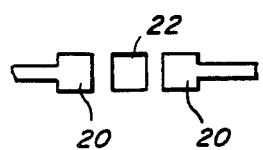
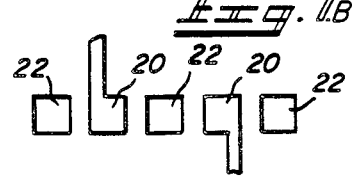
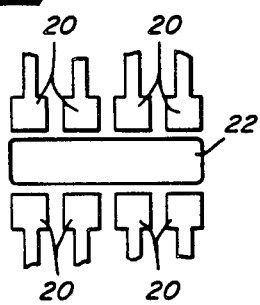
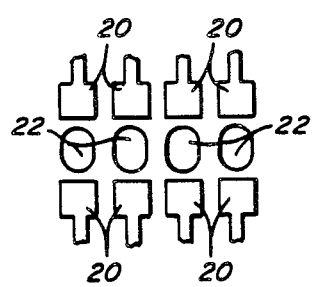
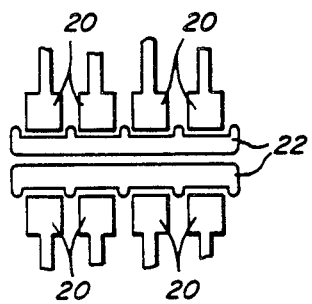
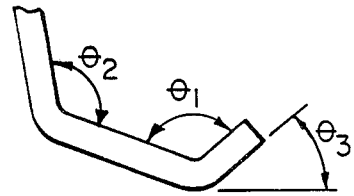
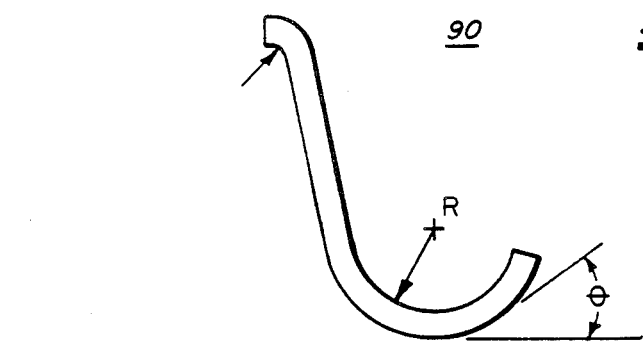

LEADFORM FOR USE WITH SURFACE MOUNTED COMPONENTS

This is a continuation of application Ser. No. 918,695, filed 10/10/86, now abandoned, which is a continuation of application Ser. No. 880,659, filed 7/1/86, now abandoned, which is a continuation of application Ser. No. 614,602, filed 5/29/84, now abandoned.

BACKGROUND OF THE INVENTION

1. Field of the Invention

This invention relates to the field of hybrid microelectronic technology and more specifically to a leadform configuration and system for mounting so called "surface mount" components on a variety of substrates in such a manner which provides solder connections which are more resistant to thermal stresses which occur in the manufacturing and operating environment of the hybrid structure.

Reference is made to U.S. patent application No. 614,366 "Mounting System for Stress Relief in Surface Mounted Components" filed on behalf of Dennis J. Derfiny et al. on May 29, 1984 and assigned to the assignee of the present invention.

2. Description of the Prior Art

Hybrid and printed circuit technologies have existed for many years, however the trend in the electronics industry is toward smaller components which are necessarily less able to resist failures which occur due to a variety of stresses. The use of leadless chip and surface mounted (So-Type packages) components in electrical and electronics assemblies has led to new problems in the way assemblies are manufactured. Depending on the type and size of components used, for example resistors, capacitors, or transistiors, the effects of circuit media type, component bonding methods, media deflection, and environmental thermal characteristics may combine to cause component degradation and eventual failure. An example of this effect is the use of ceramic leadless components on epoxy fiberglass type media. These materials exhibit a large difference in the coefficient of thermal expansion and it takes relatively few thermal excursions to weaken the component connection to the circuitry, inducing fractures and eventually failures. Component degradation of this type has been well documented and represents a growing problem with respect to circuit quality and product reliability. Thermal gradients occur during circuit soldering, bonding, or during circuit operation.

One method which has been used to counter thermal stress is to use special mixes of solder which maintain their malleability longer than conventional solder compounds. These alternatives solder compound may present special problems with handling and manufacturing as well as being typically priced five to ten times the price of standard solder compounds.

Another method for reducing stress in surface mounted leadless components is to provide end terminations on leadless components which are constructed of either silver or palladium silver. These compounds pose special problems with solder contamination and may only temporarily delay component failure.

SUMMARY OF THE INVENTION

The present invention provides a system for reducing stresses which occur during the manufacturing or use of surface mounted components. According to the preferred practice of the present invention, areas are removed from the mounting substrate which serve to dissipate or accommodate stress between the component and the substrate. The principles of the present invention also pertain to the leadform configuration leaded components. The present invention provides a new and useful leadform which serves to enhance the strength of the component/mounting substrate connection. The improved leadform provides that the lead be formed between two opposing radii, thus rendering a lead which appears rounded or angled at the end which attaches to the mounting substrate. The improved leadform exhibits improved soldering characteristics and when combined with the other teachings of the present invention, produces a high reliability assembly which can be fabricated with low cost components.

Accordingly, it is an object of the present invention to provide a printed circuit/surface mount assembly which is highly resistant to thermal stress.

It is yet another object of the present invention to provide a printed circuit/surface mountable assembly which at one exhibits improved stress charactistics while being fabricted from low cost materials.

It is yet another object of the present invention to provide an improved leadform for use with surface mounted components one feature of which is a more compliant solder connection between the leadform and the mounting substrate.

It is still another object of the present invention to provide an improved leadform for leaded components which provides for a higher reliability solder connection between the component and the mounting substrate.

BRIEF DESCRIPTION OF THE DRAWINGS

FIG. 2 is a side sectional view of the assembly of FIG. 1A taken along line 2—2 of FIG. 1A.

FIG. 3 is a side sectional view of the assembly of FIG. 1B taken along line 3—3 of FIG. 1B.

FIG. 4 is a view in persepctive of a typical prior art leaded component

FIG. 5 is a view in perspective of the improved leadform of the present invention.

FIGS. 6A and 6B is a side view of the improved leadform of the present invention.

FIGS. 7A through 7E are top views of alternative cut-out patterns which could be used to condition the printed circuit media in accordance with the teachings of the present invention.

DETAILED DESCRIPTION OF THE DRAWINGS

Figure 1A:
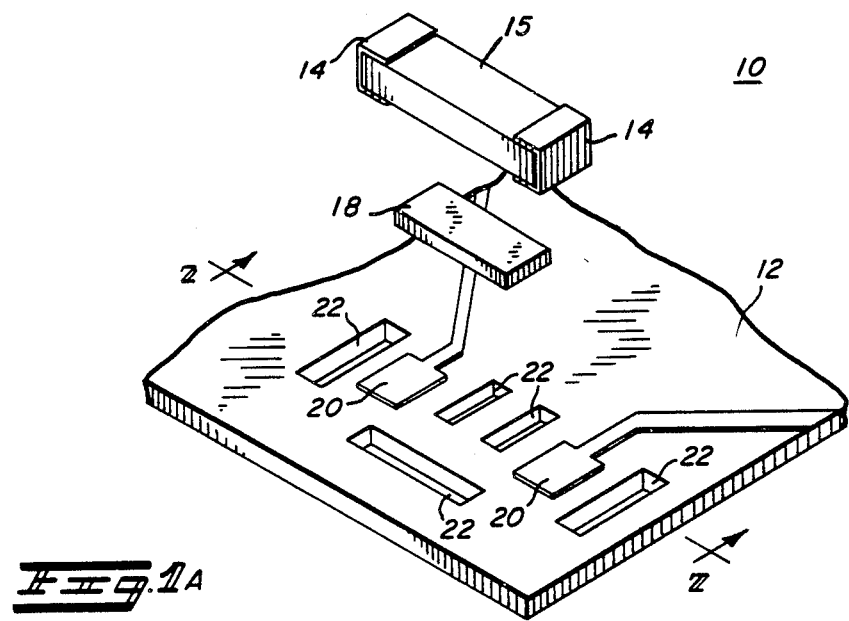
FIG. 1A is an exploded view of the one embodiment of the present invention which has been constructed within a leadless component.

FIG. 1A shows an exploded view of an embodiment of the present invention which has been constructed with a leadless component. According to the teachings of the present invention, a primary problem in the placement of leadless components is that, unless the material of the substrate media is very similar to that of the component body, a difference in the thermal coefficient of expansion will exist between the component and the substrate media. With each current carrying duty cycle of the conductors on the substrate media, there will be some heating and expansion of the components which will vary from that of the adjacent media.

Table 1 below shows the coefficients of expansion for several common materials which are used in the fabrication of microelectronic assemblies.

TABLE 1

| MATERIAL | MODULES OF ELASTICITY in $10^6$ psi | COEFFICIENT OF EXPANSION in $10^{-6}$ in/in/C |
|---|---|---|
| Barium Titanate | 16 | 9.1 |
| Niobium Titanate | 6 | 5.2 |
| Titanium Dioxide | — | 8.3 |
| Epoxy Fiberglass | 2.5 | 8.0 |
| Alumina (Ceramic) | 50 | 6.5 |
| Capacitor 0.1 uf | 8 | — |
| Capacitor 0.27 uf | 32 | — |
| Solder, SN62 | 2.2 | 7.8 |

Figure 1B:
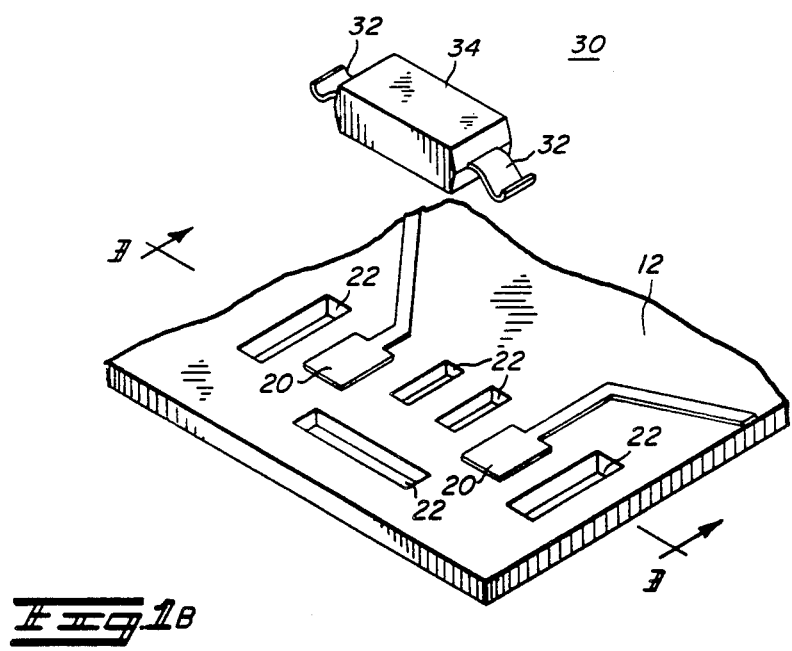
FIG. 1B is an exploded view of the preferred embodiment of the present invention which has been constructed with a leaded component wherein the leaded component is configured with the improved leadform of the present invention.

Referring now to FIGS. 1A and 1B, it can be seen that the mounting substrate of the present invention is provided with a conductive 20 pattern which carries electrical signals as well as providing a point of attachment between the electrical component and the mounting substrate. Thermal stresss which occur under the above mentioned circumstances are concentrated at the points of attachment and these points are the location of most stress related failures. According to the teachings of the present invention, a higher reliability assembly is attained by relieving stresses which occur at these locations. The present invention also provides that a higher reliability assembly is attained by improving the integrity of the solder connection between the component and the mounting substrate. Accordingly, the mounting system of the present invention includes provisions for both strengthing the point of attachment between the electrical component and the mounting substrate, as well as relieving the stresses which occur at these points.

Referring now to FIG. 1A there is shown an exploded view of a first embodiment 10 of the present invention. The mounting substrate of the present invention consists of a wafer of media material 12 which is usually selected from a family of alumina ceramics or alternatively may be of a type of glass filled epoxies. The mounting substrate is then provided with a conductive area which carries electrical signals to and from the electrical component 15. The conductive area 20 is patterned to provide a point of attachment for the electrical component 15. As mentioned above, stresses are relieved from the mounting substrate by selectively removing areas of media 12 which are immediately adjacent to the mounting areas of the electrically conductive pattern 20. The selection of particular patterns for media removal will be discussed in more detail below. However, the vacated areas may be prepared by several known processes such as laser milling or by any of several well known abrasion or stamping processes. If as in FIGS. 1A, a leadless component is to be attached to the mounting substrate 12, a spacing element 18 is disposed between the component 15 and the mounting substrate 12. The purpose of the spacing element is to induce the formation of a "virtual" lead as well as conditioning the assembly for improved flux removal. A virtual lead is one which does not exist at a time prior to attaching the component to the mounting substrate, and is formed during soldering. The characteristics of the virtual lead and flux removal of the present invention will be discussed in more detail in conjunction with the description of FIG. 3.

The stress relief system of the present invention therefor provides stress relief by allowing the mounting substrate to absorb stress forces by virtue of the points of attachment on the mounting substrate having areas of media being removed immediately adjacent to and surrounding these points. The reliability of the assembly is further enhanced by providing an improved connection at the point of attachment on the mounting substrate.

Referring now to FIG. 1B there is shown an exploded view of the preferred embodiment 30 of the present invention. The preferred embodiment 30 consists of a mounting substrate 12 which is provided with a pattern of conductive patterns 20. The conductive pattern 20 is configured to also provide a point of attachment for the electrical component 34 to the mounting substrate 12. As is FIG. 1A, the mounting substrate 12 is processed so that areas of media immediately adjacent to and surrounding the attachment points are removed. The embodiment of the present invention in FIG. 1B provides for the attachment of a leaded component 34. The leaded component 34 is provided with novel leads 32 which are specially configured to provide an improved connection between the electronic component and the mounting substrate. The improved characteristics of the novel leadform will be discussed more fully below.

Referring now to FIG. 2, there is shown a sectional side view of the assembly of FIG. 1A, which details the characteristics of the "virtual lead" formed in accordance with the teachings of the present invention. Electrical and electronics manufacturers rely on soldering systems for reliable, relatively low cost, conductive bonding of components to printed circuit (PC) media. These systems breakdown generally into three categories: Rosin flux/solvent wash, acid flux/aqueous wash, and other types of wash. One disadvantage of acid flux/aqueous wash systems is the possiblity of acid ion entrapment beneath leadless or leaded components. Acid flux is used on PC media to clean the surface to be soldered as well as enhance the "wetting" action of the solder onto the conductive portion of the mounting substrate and the component terminations. Because the flux used on PC media may be in foam, liquid, or paste form, accurately controlling its location to a limited area is difficult. Typically, the flux will flow into and around areas on the board surface adjacent to the connections being made. Some of this material is drawn, via capillary action, between the components and the PC media.

The difficulty arises some time later when the flux may become reactivated by temperature and humidity. The reactivated flux will tend to clean adjacent conductive areas so well that the metal will effectively dissolve, creating an open circuit condition and metallic ion contamination, which will dramatically affect circuit operation and reliabilty.

The problem of flux contamination and entrapment may be reduced by making it less probable that the flux will become entrapped inititally and less difficult to clean away later.

The shape of the component will have a large effect on flux entrapment and cleaning. The effect of mounting the conventional flat leadless type component body to the mounting substrate is to create a pair of very close parallel planes. Capillary action, resulting from the molecular cohesion of the thin section of flux, draws the fluid into the narrow volume existing between the component and the mounting substrate. There the flux then cools and hardens and becomes very difficult to remove.

According to a feature of the present invention, the effect of capillary action is reduced as a result of the spacing element 18 of FIG. 2. The spacing element 18 serves to raise the component 12 off the mounting substrate by a distance sufficient to minimize capillary action. The spacing element further serves to enhance the formation of a "virtual lead" by positioning the leadless component such that the solder will flow around as well as under the terminations 14 of the component body. According to the principles of the present invention, the spacing element is fabricated of an electrically inert material, such as a phenolic solid, which has been coated with an adhesive such as epoxy. The spacing element is then attached the component body, which is then placed on the mounting substrate. The assembly is the soldered by standard methods.

Referred now to FIG. 3, there is shown a sectional side view of the assembly of FIG. 1B. The preferred embodiment conforms the teachings of the present inventon to the attachment of leaded components to a mounting substrate while yielding the benefits the mounting system of the present invention. This embodiment comprises a leaded component 34 which is provided with improved leadforms 32. The leadforms 32 attach to the conductive pattern 20 which is further deposited on the mounting substrate 12. As in FIG. 1B, the mounting substrate is prepared with areas of media removed surrounding the points of attachment so that the points of attachment are stress relieved on the mounting substrate 12.

Referred now to FIG. 4, there is shown a leaded component which is provided with a conventional leadform. The relative size of the leadform shown in FIG. 4 is exaggerated for the purposes of illustration. The conventional leadform typically exits the component 70, bends downward, and terminates with the leadform being parallel with the mounting substrate.

Referring now to FIG. 5, there is shown a view in perspective of the improved leadform of the present invention. As in FIG. 4, the relative size of the leadform is exaggerated for the purposes of illustration. According to the principles of the present invention, conventional leadforms which are plated on both top and bottom surfaces, cannot gain advantage of the plating on the bottom surface of the leadform because the shape of the leadform prevents solder from attaching to the undersurface as this area is blocked from solder flow. The leadform of the present invention allows solder to attach to both surfaces of the leadform by virtue of a turned-up or "elf toe" termination.

FIG. 6A is a side view of the lead form of FIG. 5. FIG. 6B shows an alternative implementation of the "elf toe" leadform of the preset invention. FIG. 6A shows a leadform which exits a component body in a conventional fashion. The unattached end of the leadform is then formed having a curvature with radius R. The exact radius of curvature R is not critical to the practice of the present invention. However, the practice of the present invention requires that a line drawn tangentially to the radius of curvature of the leadform and having an angle 0 with respect to the substrate should lie between 10 and 45 degrees with respect to the mounting substrate to gain the maximum strengthening characteristics of the improved leadform. The lead may be formed with any of a number of conventional processes which are well known to those having skill in the art.

Referring now to FIG. 6B, there is shown an alternate implementation of the improved leadform of the present invention. According to FIG. 6B, the advantages of the improved leadform may be attained by forming an otherwise conventional lead with two opposing obtuse angles, thereby rendering an "elf toe" leadform having a heel and toe at the terminal end of the leadform wherein the terminal portion of the leadform is in angular relation with respect to the mounting substrate. As in the embodiment of FIG. 6A, the maximum benefit of the improved leadform is attained when the angle formed by the terminal portion of the leadform and the mounting substrate is between 10 and 45 degrees. The embodiments shown in FIGS. 6A and 6B are included for illustrative purposes and a number of alternate leadforms would satisfy the teachings of the present invention, however, an important feature of the improved leadform is the angular relationship between the terminal portion of the leadform and the mounting substrate.

Referring now to FIG. 7, there is shown several alternate cutout patterns which could be used to prepare the mounting substrate in accordance with the teachings of the present invention. The mounting pads 20 are conventional, and are prepared according to conventional methods. The cutouts 22 may be of a number of alternate shapes as shown in FIGS. 7A through 7E. The cutout areas may be prepared with any of a number of conventional processes such as stamping or laser milling. The primary effect of the cutout patterns is to relieve stress by allowing the substrate media to expand in the cutout areas thereby allowing stress relief between the mounting pads 20 and the mounting substrate. Several other cutout patterns may be used in accordance with the teachings of the present invention, and FIGS. 7A through 7E are included for illustrative purposes, and are not meant to limit the spirit and scope of the present invention.

Accordingly, a system for stress relief in surface mounted components is described. The mounting system of the present invention includes a preparation of the mounting substrate to allow stress relieving of mounting areas and the substrate. The teachings of the present invention also provide a means of improving the integrity of the structure by providing an improved solder connection at the points of contact between the surface mounted component and the mounting substrate.

Accordingly, other uses and modifications will be apparent to one skilled in the art without departing from the spirit and scope of the present invention.

What claimed is:

1. An improved leadform which attaches a surface mountable component to a printed circuit substrate and which has improved integrity at the point of attachment, said leadform comprising an essentially rectangular prismatic conductive lead formed such that said lead has an essentially "S" shaped side view with a radius of curvature curving said lead in a first direction and at least first and second angles opposing said radius of curvature and bending said lead in a second direction, said lead extending away from an external surface of the surface mountable component and curving with said radius of curvature in said first direction toward said printed circuit substrate and said lead having an end opposite said external surface, said end separated from said external surface by the combination of said at least first and second angles said at least first and second angles bending said lead away from said printed circuit substrate in said second direction thereby forming a third angle between said printed circuit substrate and said lead including said end.

2. An improved leadform in accordance with claim 1 wherein said lead is attached to said printed circuit substrate at least at the vertex of said first angle and said second angle is disposed between said radius of curvature and said first angle.

3. An improved leadform in accordance with claim 1 wherein said third angle further comprises an angle between 10 and 45 degrees.

4. A surface mountable electronic component which is attached to a printed circuit substrate by conductive bonding means and which has improved integrity at the bonding point, comprising:

an electronic component body having at least two substantially parallel external surfaces;

at least two essentially rectangular prismatic conductive leads formed such that each lead has an essentially "S" shaped side view with a radius of curvature and at least first and second angles bending each said lead in a direction opposing said radius of curvature, a first one of said at least two conductive leads extending away from a first one of said at least two external surfaces and curving with said radius of curvature toward said printed circuit substrate, and a second one of said at least two conductive leads extending away from a second of said at least two external surfaces and curving with said radius of curvature toward said printed circuit substrate, each said lead having an end opposite each respective external surface, said end separated from each respective external surface by the combination of said at least first and second angles, said at least first and second angles bending said lead away from said printed circuit substrate whereby a third angle is formed between said printed circuit substrate and each said lead including said end of each respective lead.

5. A surface mountable electronic component in accordance with claim 4 wherein each said lead is attached to said printed circuit substrate at least at the vertex of said first angle and said second angle is disposed between said radius of curvature and said first angle.

6. A surface mountable electronic component in accordance with claim 4 wherein said third angle further comprises an angle between 10 and 45 degrees.

* * * * *